(12) United States Patent
Stirton

(10) Patent No.: US 6,383,888 B1
(45) Date of Patent: May 7, 2002

(54) METHOD AND APPARATUS FOR SELECTING WAFER ALIGNMENT MARKS BASED ON FILM THICKNESS VARIATION

(75) Inventor: James Broc Stirton, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/837,712

(22) Filed: Apr. 18, 2001

(51) Int. Cl.[7] ............................................... H01L 21/76
(52) U.S. Cl. ............................. 438/401; 430/5; 430/22
(58) Field of Search ........................... 438/401; 430/22, 430/394, 5

(56) References Cited

U.S. PATENT DOCUMENTS 4,431,923 A * 2/1984 Wang et al.
6,141,107 A * 10/2000 Nishi et al.

* cited by examiner

Primary Examiner—Jey Tsai
(74) Attorney, Agent, or Firm—Williams, Morgan & Amerson, P.C.

(57) ABSTRACT

A method for aligning wafers includes providing a wafer having at least a first and a second alignment mark formed thereon, each alignment mark comprising a grating structure; illuminating the grating structure of the first alignment mark with a light source; measuring light reflected from the grating Structure of the first alignment mark to generate a first reflection profile; illuminating the grating structure of the second alignment mark with the light source; measuring light reflected from the grating structure of the second alignment mark to generate a second reflection profile; and selecting one of the first and second alignment marks for aligning the wafer based on the first and second reflection profiles. A processing line includes a metrology tool and a process controller. The metrology tool is adapted to receive a wafer having at least a first and a second alignment mark formed thereon. Each alignment mark comprises a grating structure. The metrology tool is further adapted to illuminate the grating structure of the first alignment mark with a light source, measure light reflected from the grating structure of the first alignment mark to generate a first reflection profile, illuminate the grating structure of the second alignment mark with the light source, and measure light reflected from the grating structure of the second alignment mark to generate a second reflection profile. The process controller is adapted to select one of the first and second alignment marks for aligning the wafer based on the first and second reflection profiles.

28 Claims, 8 Drawing Sheets

METHOD AND APPARATUS FOR SELECTING WAFER ALIGNMENT MARKS BASED ON FILM THICKNESS VARIATION

BACKGROUND OF THE INVENTION

1. Field of the Invention

This invention relates generally to the field of semiconductor device manufacturing and, more particularly, to a method and apparatus for selecting wafer alignment marks based on film thickness variation.

2. Description of the Related Art

During the manufacture of semiconductor devices, semiconductor wafers, each including a plurality of individual die, are subjected to a number of processing steps. Typically, wafers are grouped into lots that are processed together. Each lot may contain, for example, 25 individual wafers. Certain of the processing steps are sensitive to the alignment of the wafer within the processing tool. For example, photolithography processing steps are highly sensitive to the alignment of the wafer. Other steps, including metrology steps, are also sensitive to wafer alignment, but to differing degrees.

FIG. 1 illustrates a typical semiconductor wafer 100. The wafer 100 includes an orientation notch 110 useful as a reference point for a rough alignment of the wafer 100. For identification purposes, a unique wafer identification code 120 is scribed on the wafer 100 beneath the notch 110 using a laser scribing process where small dots are burned into the surface of the wafer to construct the characters or symbols of the code. Exemplary wafer identification codes 120 may include alphanumeric identifiers or bar code identifiers (e.g., 1 or 2 dimensional codes). During the production process, process history and metrology information is stored in a database for each of the wafers 100 indexed by its respective wafer identification code 120.

Typically, prior to performing an orientation-sensitive process, the wafer 100 is rotated until the notch 110 is located and placed in a predetermined position. Other techniques for performing rough alignments include using an edge alignment procedure where the wafer 100 is rotated and optically scanned to determine the profile of the edge at various positions about the rotation. Typically, a wafer 100 is not perfectly round. As such, the edge moves with respect to a fixed reference point as the wafer 100 is rotated. By determining the edge profile, the approximate center of the wafer 100 can be determined. The spatial relationship between the notch 110 and the approximate center point may be then used as a reference point for rough alignment of the wafer.

These rough alignment techniques are not suitable for highly sensitive processes such as photolithography. Accordingly, multiple sets of alignment marks 130, 135, 140 are etched into the wafer 100 near the periphery prior to the commencement of process steps for forming devices on the wafer 100. A wafer 100 typically includes a plurality of individual semiconductor die 150 arranged in a grid 155. Photolithography steps are typically performed by a stepper on approximately one to four die locations at a time, depending on the specific photomask employed. The alignment marks 130, 135, 140 provide an accurate reference point for aligning the stepper to the individual cells in the grid 155 that are to be exposed. The stepper includes sensitive optical scanning equipment to locate the alignment marks 130, 135, 140 and finely align the wafer 100 based on the alignment marks 130, 135, 140 such that the individual die 150 are accurately patterned.

Typically, the stepper selects one of the sets of alignment marks 130, 135, 140 for alignment. Although only three sets of alignment marks 130, 135, 140 are shown, more sets may be possible. The different sets of alignment marks 130, 135, 140 are disposed at different distances from the edge of the wafer 100. For example, the alignment marks 130, 135 may be disposed about 4 nm from the edge and the alignment marks 140 may be disposed 5 nm from the edge. Because of the different positions of the alignment marks 130, 135, 140, they are not subject to the exact same processing environment. Accordingly, the ability of the stepper to align to one set of alignment marks 130, 135, 140 may differ from its ability to align to the other set of alignment marks 130, 135, 140. If one particular set of alignment marks 130, 135, 140 is damaged by processing, resulting in a lower signal to noise ratio in the alignment process, the stepper may use an alternative set of alignment marks 130, 135, 140 having a higher signal to noise ratio.

Generally, the stepper selects one set of the alignment marks 130, 135, 140 as a default set, aligns the wafer 100 using the selected set of alignment marks 130, 135, 140, and exposes a layer of photoresist material to form a desired pattern. If the set of alignment marks 130, 135, 140 chosen had a relatively low signal to noise ratio, the alignment may be incorrect. In some cases alignment errors may be detected, and the wafer 100 may be reworked. During the rework, a different set of alignment marks 130, 135, 140 is selected by the stepper to align the wafer 100. In other cases, the alignment error is not detected until after a process that may not be reversed has been performed (e.g., etching). In such as case, the wafer 100 must be scrapped. Reworking or the scrapping the wafer is expensive and reduces the efficiency of the processing line.

As seen in FIG. 2A, an illustrative grating structure 200 used to define the alignment marks 130, 135, 140 is shown. The grating structure 200 includes trenches 210 formed in a silicon substrate 220, shown in cross-section in FIGS. 2B and 2C. A variety of different constructs for the grating structure 200 may be used. For example, an alternate grating structure may comprise a single, rectangular group of trenches.

As shown in FIG. 2B, during the fabrication of shallow trench isolation (STI) structures on the wafer 100, a layer of silicon nitride 230 is deposited on the wafer 100 for use as a stop layer for chemical mechanical polishing. A layer of silicon dioxide 240 formed using tetraethoxysilane (TEOS) is formed over the silicon nitride 230 (i.e., other layers, such as a silicon oxynitride antireflective coating layer (ARC) (not shown) and a liner oxide layer (not shown) may be disposed between the silicon nitride stop layer 230 and the silicon dioxide layer 240), The silicon nitride stop layer 230 is deposited over the entire wafer 100, including over the grating structure 200. The silicon dioxide layer 240 is subsequently polished to remove excess material, and the silicon nitride stop layer 230 is stripped.

Typical CMP polishing processes do not tightly control the polish rates near the edges of the wafer 100 (i.e., where the alignment marks 130, 135, 140 are located), because no devices are present in that region and also because there are no available metrology techniques for monitoring the polishing rates near the edges. Accordingly, the edge regions may be overpolished or underpolished with respect to the other portions of the wafer 100. If the edge region is over polished, all of the silicon nitride stop layer 230 is polished away and a portion of the silicon substrate 220 in which the trenches 210 are formed is also removed. If a portion of the edge region is underpolished, remnants of the silicon oxide layer 240 may remain over the trenches 220 and interfere with the subsequent stripping of the nitride stop layer 230. As seen in FIG. 2C, in an overpolished region 250, the depth of the trenches 210 is reduced. In an underpolished region 260, remnants of the silicon nitride stop layer 230 remain in the bottom of the trenches 210.

The remnants of the silicon nitride stop layer 230 result in a degradation of the signal to noise ratio when the alignment marks 130, 135, 140 are used for subsequent optical alignment. In some of the trenches 210, no remnants may be present (i.e., no underpolishing). For the trenches 210, with silicon nitride remnants 220, the amount of remaining silicon nitride typically follows an increasing or decreasing trend as the distance from the edge of the wafer 100 increases in accordance with the surface gradient caused by the polishing variation.

Because of the variation caused by the overpolishing or underpolishing, it is difficult to predict which set of alignment marks 130, 135, 140 will have a higher signal to noise ratio. For example, some wafers may be uniformly underpolished or overpolished, some wafers may be overpolished nearer the edge and underpolished further from the edge (i.e., as shown in FIG. 2C), and still other wafers may be underpolished nearer the edge and overpolished further from the edge.

Polishing variation may also be present in processing steps directed to forming other structures on the wafer 100. This variation can have a similar degrading effect on the alignment marks 130, 135, 140. For example, certain metal layers subsequently formed on the wafer 100 are polished. Polishing variation in the region where the alignment marks are located may also result in remnants of other process layer being deposited in the trenches 210 of the grating structure 200 used to define the alignment marks 130, 135, 140.

The present invention is directed to overcoming, or at least reducing the effects of, one or more of the problems set forth above.

SUMMARY OF THE INVENTION

One aspect of the present invention is seen in a method for aligning wafers. The method includes providing a wafer having at least a first and a second alignment mark formed thereon, each alignment mark comprising a grating structure; illuminating the grating structure of the first alignment mark with a light source; measuring light reflected from the grating structure of the first alignment mark to generate a first reflection profile; illuminating the grating structure of the second alignment mark with the light source; measuring light reflected from the grating structure of the second alignment mark to generate a second reflection profile; and selecting one of the first and second alignment marks for aligning the wafer based on the first and second reflection profiles.

Another aspect of the present invention is seen in a processing line including a metrology tool and a process controller. The metrology tool is adapted to receive a wafer having at least a first and a second alignment mark formed thereon. Each alignment mark comprises a grating structure. The metrology tool is further adapted to illuminate the grating structure of the first alignment mark with a light source, measure light reflected from the grating structure of the first alignment mark to generate a first reflection profile, illuminate the grating structure of the second alignment mark with the light source, and measure light reflected from the grating structure of the second alignment mark to generate a second reflection profile. The process controller is adapted to select one of the first and second alignment marks for aligning the wafer based on the first and second reflection profiles.

BRIEF DESCRIPTION OF THE DRAWINGS

The invention may be understood by reference to the following description taken in conjunction with the accompanying drawings, in which like reference numerals identify like elements, and in which.

Figure 1:
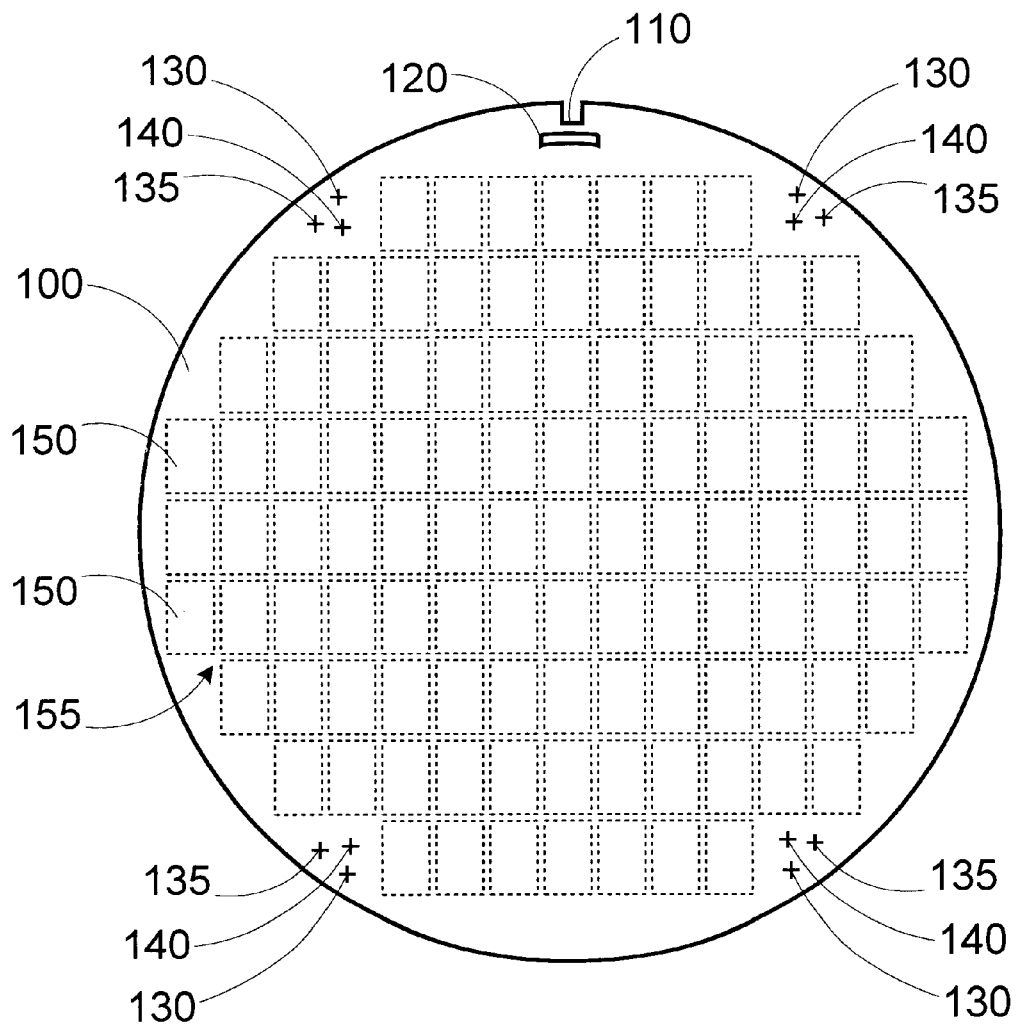
FIG. 1 is a simplified diagram of a prior art semiconductor wafer including alignment marks useful for aligning the wafer in a photolithography process.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2A:
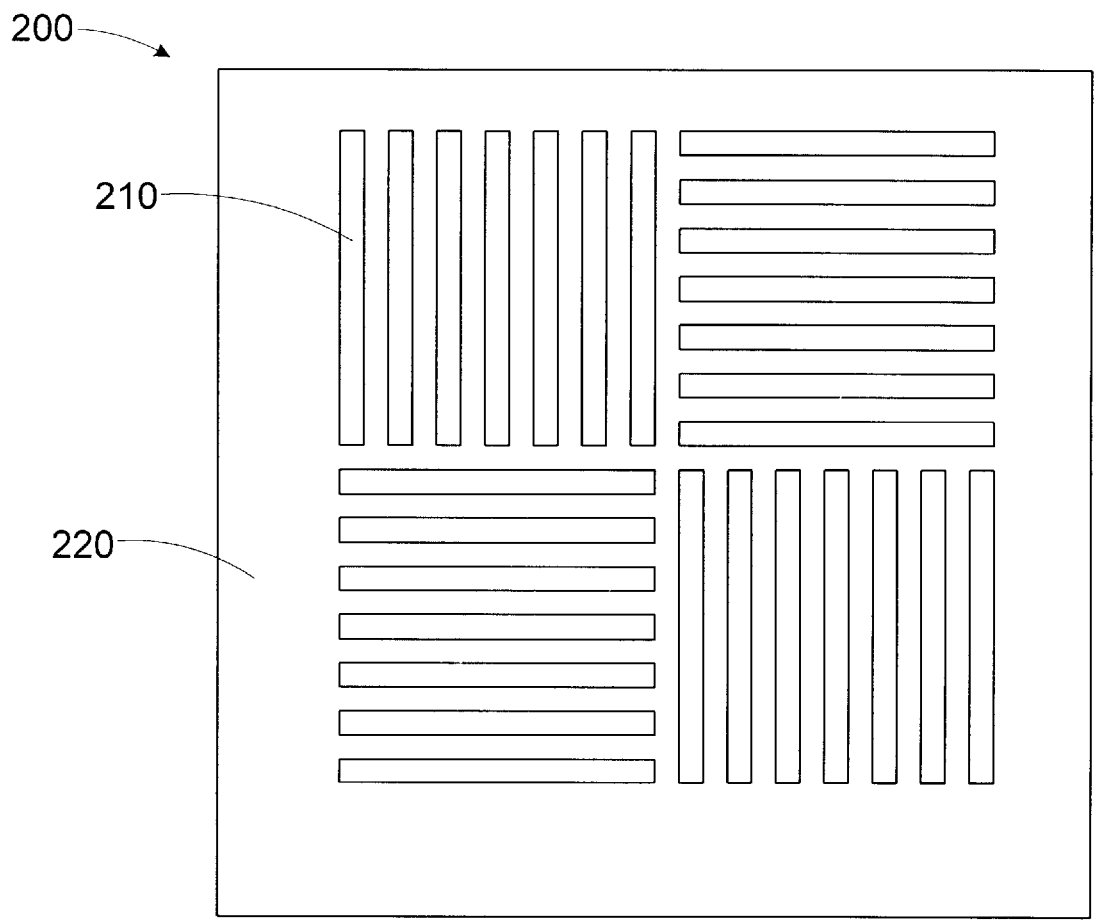
FIG. 2A is a top view of an exemplary grid structure used to form an alignment mark disposed on the wafer of FIG. 1.
Figure 2B:
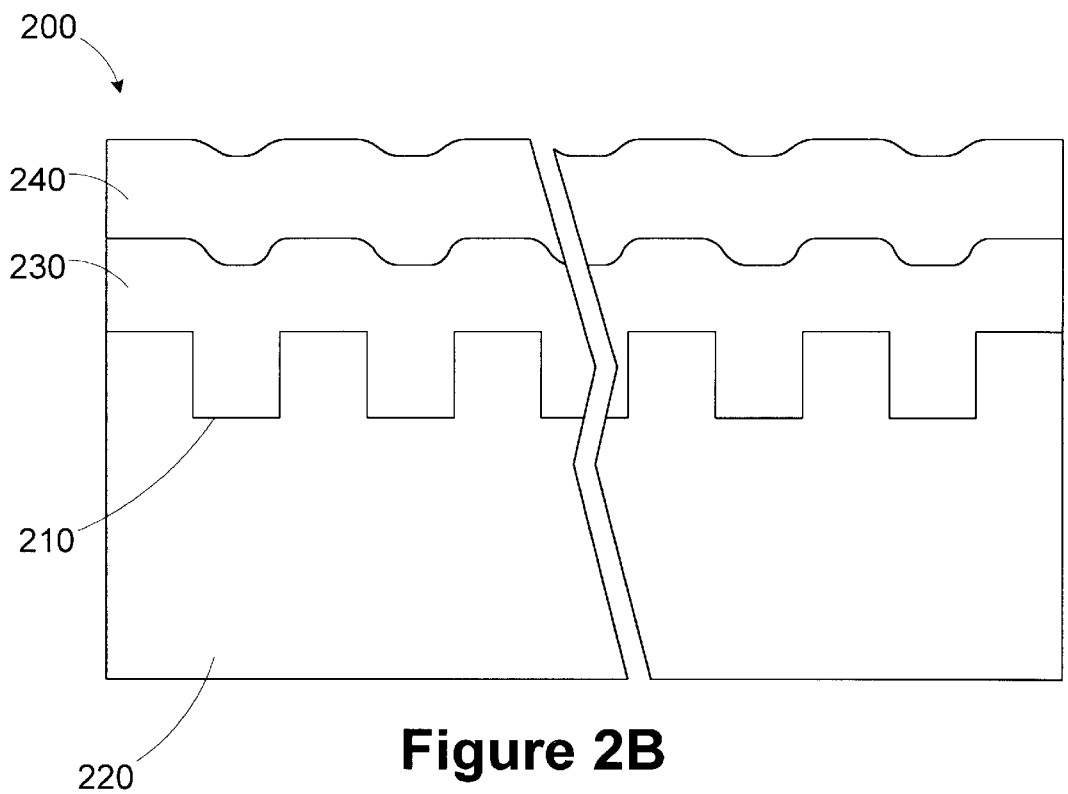
FIG. 2B is a cross section view of the grid structure of FIG. 2A after the formation of a silicon nitride stop layer and a silicon dioxide layer used to form features on the wafer of FIG. 1.
Figure 2C:
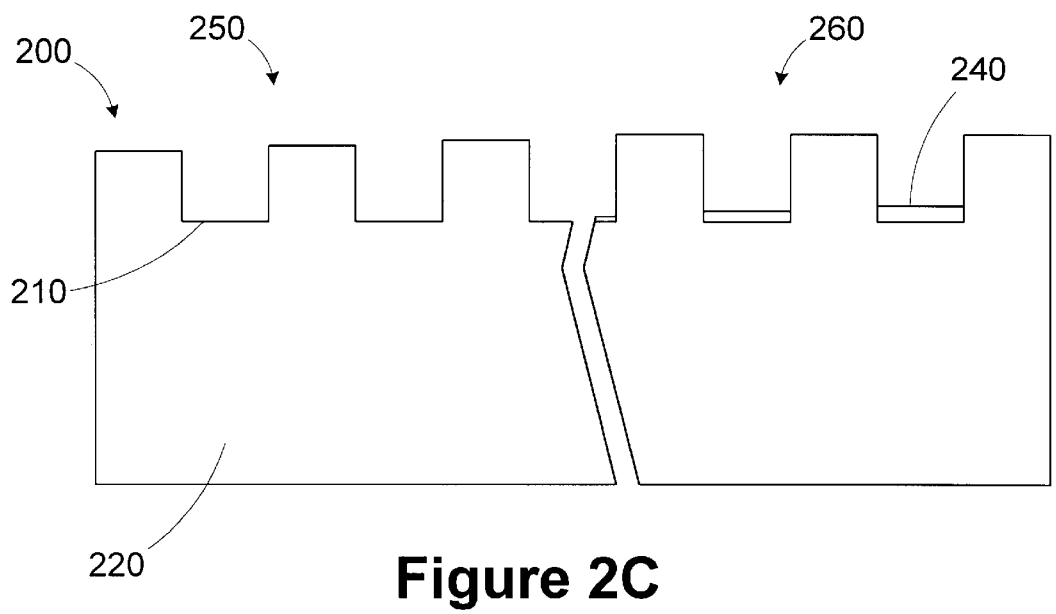
FIG. 2C is a cross section view of the grid structure of FIG. 2B illustrating how polishing variation may affect the grid structure and effective removal of the silicon nitride stop layer.
Figure 3:
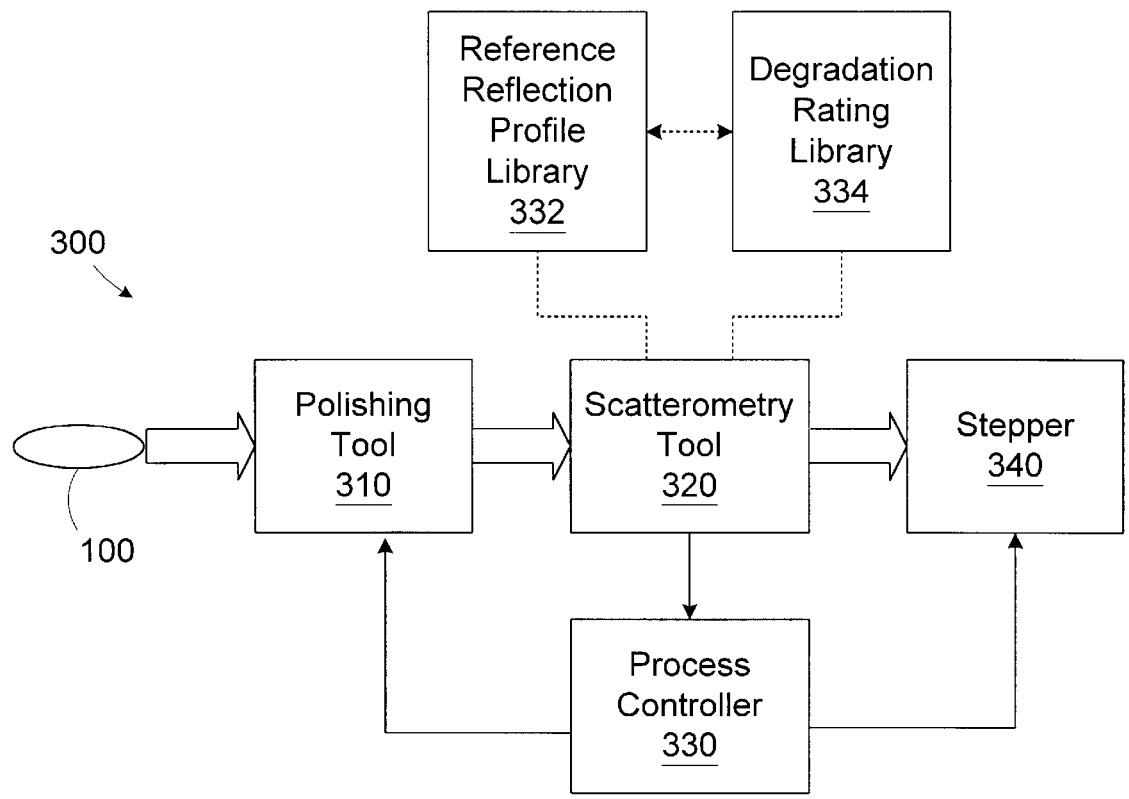
FIG. 3 is a simplified diagram of an illustrative processing line for processing wafers in accordance with one illustrative embodiment of the present invention.

Referring to FIG. 3, a simplified diagram of an illustrative processing line 300 for processing wafers 100 in accordance with one illustrative embodiment of the present invention is provided. The processing line 300 includes a polishing tool 310 for polishing the wafers in accordance with a polishing recipe. The polishing tool 310 may be used to polish process layers formed on the wafer 100, such as the silicon nitride and silicon dioxide layers described above in reference to FIGS. 2A, 2B, and 2C, metal layers, or other process layers. Variations in the polishing rate of the polishing tool 310 in the regions of the wafer 100 where the alignment marks 130, 135, 140 (see FIG. 1) are disposed may cause degradation of the alignment marks 130, 135, 140, as previously described in detail.

The processing line 300 includes a scatterometry tool 320 adapted to measure the degradation of the alignment marks 130, 135, 140 as described in greater detail below in reference to FIGS. 4, 5A, 5B, and 5C. In general, the scatterometry tool 320 includes optical hardware, such as an ellipsometer or reflectometer, and a data processing unit loaded with a scatterometry software application for processing data collected by the optical hardware. For example, the optical hardware may include a model OP5230 or OP5240 with a spectroscopic ellipsometer offered by Thermawave, Inc. of Freemont Calif. The data processing unit may comprise a profile application server manufactured by Timbre Technologies, a fully owned subsidiary of Tokyo Electron America, Inc. of Austin, Tex. and distributed by Thermawave, Inc.

A process controller 330 is provided for configuring other tools in the processing line 300 based on the degradation of the alignment marks 130, 135, 140. For example, the process controller 330 may configure a stepper 340 used to perform subsequent exposure processes on a layer of photoresist on the wafer 100 to use the alignment marks 130, 135, 140 having the least amount of degradation. The process controller 330 may also provide feedback to the polishing tool 310 and adjust its operating recipe to improve the uniformity of the polishing process and reduce polishing variation and alignment mark degradation for subsequently polished wafers 100.

In the illustrated embodiment, the process controller 330 is a computer programmed with software to implement the functions described. However, as will be appreciated by those of ordinary skill in the art, a hardware controller designed to implement the particular functions may also be used. Moreover, the functions performed by the process controller 330, as described herein, may be performed by multiple controller devices distributed throughout a system. Additionally, the process controller 330 may be a stand-alone controller, it may be integrated into a tool, such as the polishing tool 310, scatterometry tool 320, or the stepper 340, or it may be part of a system controlling operations in an integrated circuit manufacturing facility.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 330 as described is the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 4:
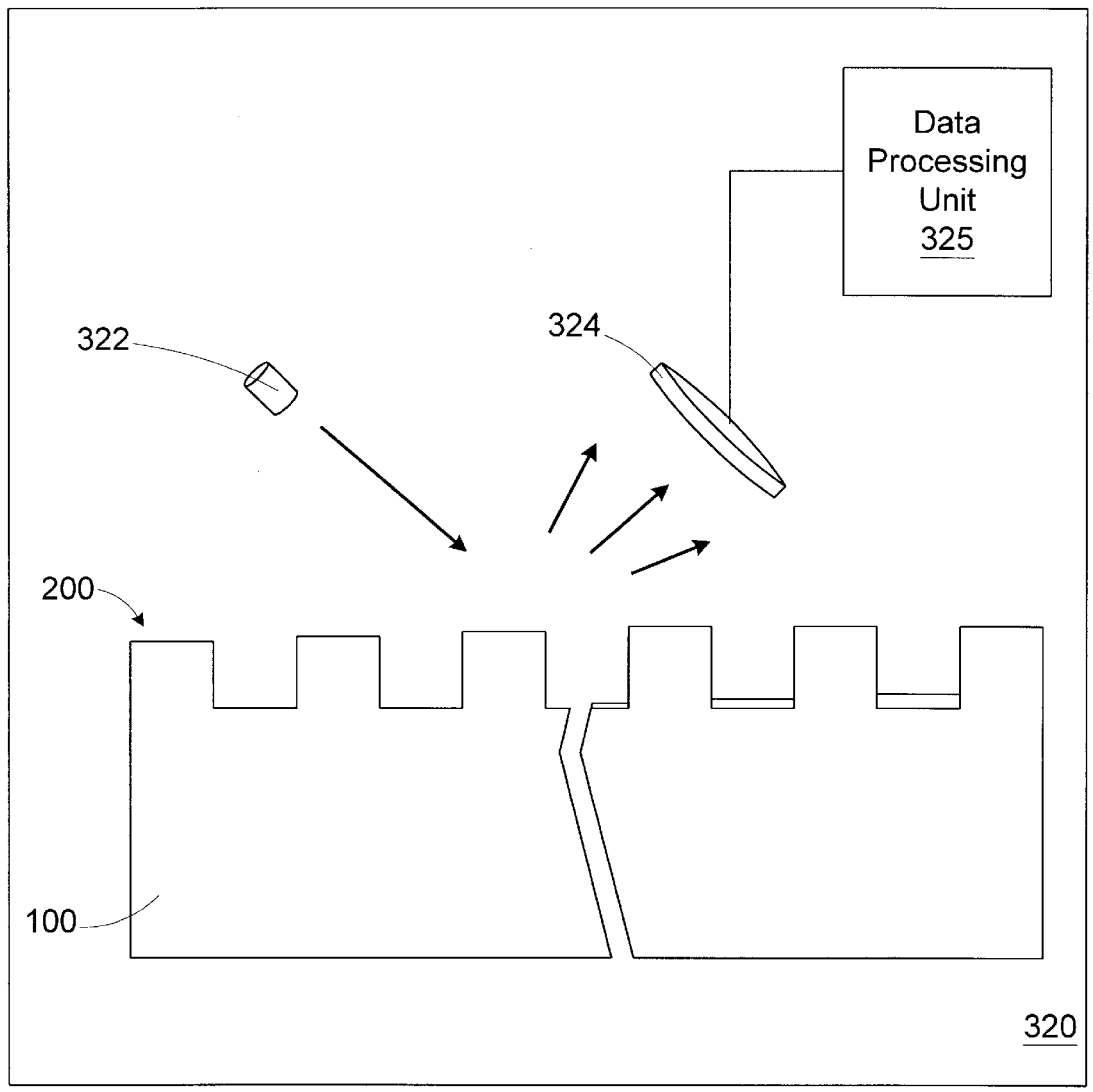
FIG. 4 is a simplified view of the scatterometry tool of FIG. 3 loaded with a wafer having the grating structure of FIG. 2C formed thereon.

Turning now to FIG. 4, a simplified view of the scatterometry tool 320 loaded with a wafer 100 having the grating structure 200 (see FIG. 2C) formed thereon. The scatterometry tool 320, includes a light source 322 and a detector 324 positioned proximate the grating structure 200. The light source 322 of the scatterometry tool 320 illuminates at least a portion of the grating structure 200, and the detector 324 takes optical measurements, such as intensity or phase, of the reflected light. A data processing unit 325 receives the optical measurements from the detector 324 and processes the data to determine the degradation of the grating structure 200.

The scatterometry tool 320 may use monochromatic light, white light, or some other wavelength or combinations of wavelengths, depending on the specific implementation. The angle of incidence of the light may also vary, depending on the specific implementation. The light analyzed by the scatterometry tool 320 typically includes a reflected component (i.e., incident angle equals reflected angle) and a refracted component (i.e., incident angle does not equal the reflected angle). For purposes of discussion hereinafter, the term "reflected" light is meant to encompass both components.

The variations in the grating structure 200 caused by the polishing variation (e.g., reduced trench depth in an over-polished region and process layer remnants in an underpolished region) causes changes in the reflection profile (e.g., intensity vs. wavelength–tan($\delta$), phase vs. wavelength–sin ($\psi$), where $\delta$ and $\psi$ are common scatterometry outputs known to those of ordinary skill in the art) measured by the scatterometry tool 320 as compared to the light scattering profile that would be present in a perfectly polished wafer, or at least acceptable wafer, with no trench depth reduction or process layer remnants or an acceptable amount thereof. The scatterometry tool 320 measures individual reflection profiles for the alignment marks 130, 135, 140 formed on the wafer 100. A difference in the reflection profiles for the different alignment marks 130, 135, 140 indicates a variation in the relative degrees of degradation.

Figure 5A:
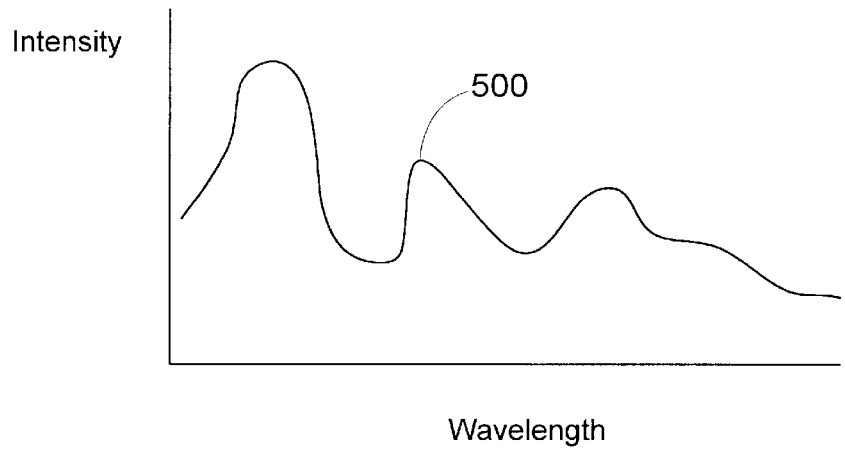
FIGS. 5A, 5B, and 5C illustrate a library of exemplary scatterometry curves used to characterize the wafer measured in the scatterometry tool of FIG. 4.
Figure 5B:
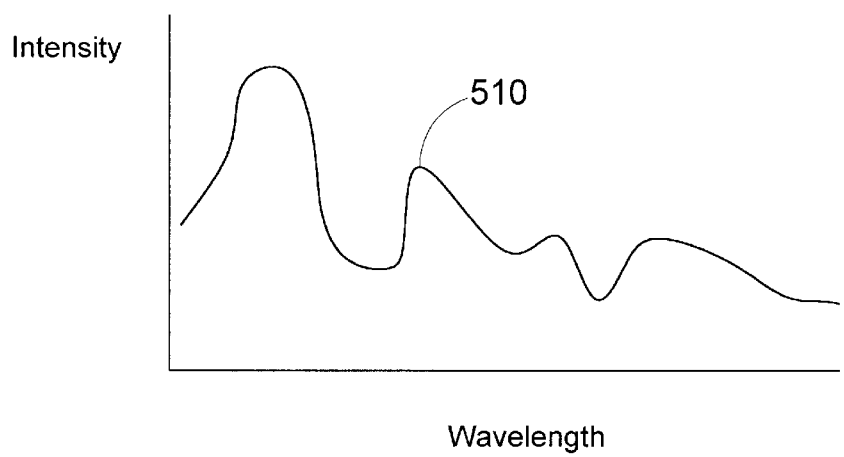
Figure 5C:
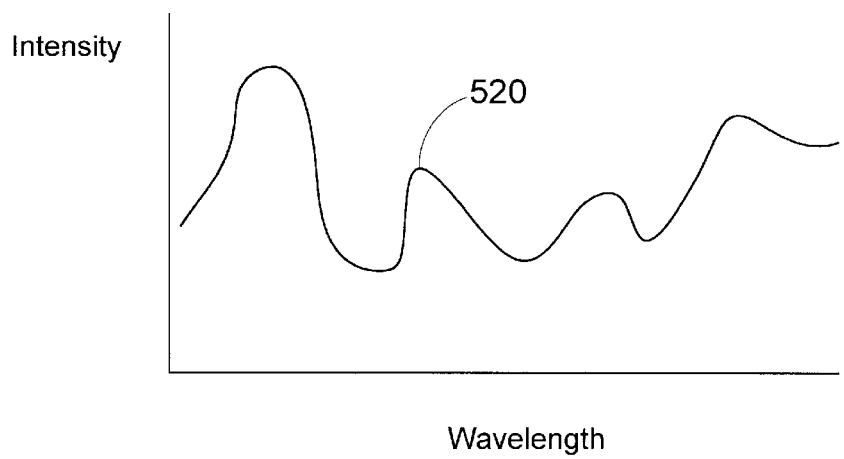

FIGS. 5A, 5B, and 5C illustrate exemplary reflection profiles 500, 510, 520 that may be included in a reference reflection profile library 332 (see FIG. 3) used by the data processing unit 325 to characterize the degradation of the alignment marks 130, 135, 140 based on the reflection profiles measured by the scatterometry tool 320 for the actual wafer 100. The particular reflection profile expected for any structure depends on the specific geometry of the structure and the parameters of the measurement technique employed by the scatterometry tool 320 (e.g, light bandwidth, angle of incidence, etc.). The profiles in the reference reflection profile library 332 are typically calculated theoretically by employing Maxwell's equations based on the characteristics of the grating structure 200. The process for generating reference reflection profiles is well known to those of ordinary skill in the art, and accordingly, it is not described in greater detail herein for clarity and so as not to obscure the invention. For example, scatterometry libraries are commercially available from Timbre Technologies, Inc. The profiles in the reference reflection profile library 332 may also be generated empirically by measuring reflection profiles of sample wafers and subsequently characterizing the measured wafers by destructive or non-destructive examination techniques.

The reflection profile 500 of FIG. 5A represents an expected profile for an alignment mark 130, 135, 140 with no degradation (i.e., no overpolishing or underpolishing), or at least an acceptable level of degradation. The reflection profile 510 of FIG. 5B represents an expected profile for an alignment mark 130, 135, 140 with trench depth degradation resulting from overpolishing (i.e., the overpolished region 250 of FIG. 2C). The reflection profile 520 of FIG. 5C represents an expected profile for an alignment mark 130, 135, 140 with underpolishing degradation caused by process layer remnants disposed in the trenches 210 of the grating structure 200 (ie., the underpolished region 260 of FIG. 2C). The reflection profile of an alignment marks 130, 135, 140 with a combination of overpolishing and underpolishing (i.e., a polishing gradient resulting in some trenches 210 with a reduced depth and other trenches 210 with an increasing amount of remnant process layer material) will include components of both the overpolish and underpolish reflection profiles 510, 520. For example, overpolishing may be evident by a change in one portion of the reflection profile, while underpolishing may be evident by a change in a different portion of the reflection profile. To generate a reference reflection profile for a wafer having a polishing gradient, a linear or hyperbolic perturbation may be incorporated into the equations used to calculate the overpolishing or underpolishing reference profiles. The differences depicted in the reference reflection profiles 500, 510, 520 are merely illustrative. In an actual implementation, the specific differences may vary.

The data processing unit 325 compares the measured reflection profile to the reference reflection profile library 332. Each reference profile has an associated polishing profile (e.g., overpolishing, underpolishing, or a combination of both), and may be linked to a degradation rating library 334 (see FIG. 3). The data processing unit 325 determines the reference reflection profile having the closest match to the measured reflection profile. Techniques for matching the measured reflection profile to the closest reference reflection profile are well known to those of ordinary skill in the art, so they are not described in greater detail herein.

In another embodiment, the process controller 330 or other external controller (not shown) may be adapted to compare the measured reflection profile to the reference reflection profile library 332. In such a case, the scatterometry tool 320 would output the matching reference reflection profile, and the process controller 330 may link that reference reflection profile to an associated profile in the degradation rating library 334.

In another embodiment, the measured reflection profile associated with the grating structure 200 may be compared to a target reflection profile selected from the reference reflection profile library 332 having a known and desired, or acceptable profile. For example, a target reflection profile may be calculated for a grating structure 200 having an ideal or acceptable profile using Maxwell's equations, and that target reflection profile may be stored in the reference reflection profile library 332. Thereafter, the measured reflection profile of a grating structure 200 having an unknown level of degradation is compared to the target reflection profile. Based upon this comparison, a relatively rough approximation of the degradation of alignment mark 130, 135, 140 may be determined. For example, the approximation may indicate an underpolish or overpolish condition. That is, by comparing the measured reflection profile to the target reflection profile, it may be determined which of the alignment marks 130, 135, 140 has the least amount of degradation, such that further matching of the measured reflection profile with additional reference reflection profiles from the reference reflection profile library 332 is unwarranted. Using this technique, an initial determination may be made as to the acceptability of the alignment marks 130, 135, 140. Of course, this step may be performed in addition to the matching or correlating of a measured reflection profile to a reference reflection profile from the reference reflection profile library 332 as described above.

After receiving the polishing profile and characterization of the degradation of the alignment marks 130, 135, 140 from the scatterometry tool 320, the process controller 330 may take a variety of autonomous actions. In one embodiment, the process controller 330 is adapted to configure the stepper 340 to use the alignment marks 130, 135, 140 having the least amount of degradation (i.e., the highest signal to noise ratio). In this embodiment, the scatterometry tool 320 is used to measure light reflected from a sample of the alignment marks 130, 135, 140. In some embodiments, all of the alignment marks 130, 135, 140 may be measured. The data processing unit 325 matches reflection profiles for each of the alignment marks 130, 135, 140 in the sample to the reference reflection profile library 332.

The process controller 330 then uses the degradation information to select the alignment mark 130, 135, 140 or set of alignment marks having the least amount of degradation and configures the stepper 340 to use the selected alignment mark 130, 135, 140 when it aligns the wafer 100. The preferred alignment marks 130, 135, 140 for each wafer 100 may be stored in a database (not shown) for future use. As more processing steps are performed on the wafer 100, the process may be repeated and the preferred alignment marks 130, 135, 140 may change.

Figure 6:
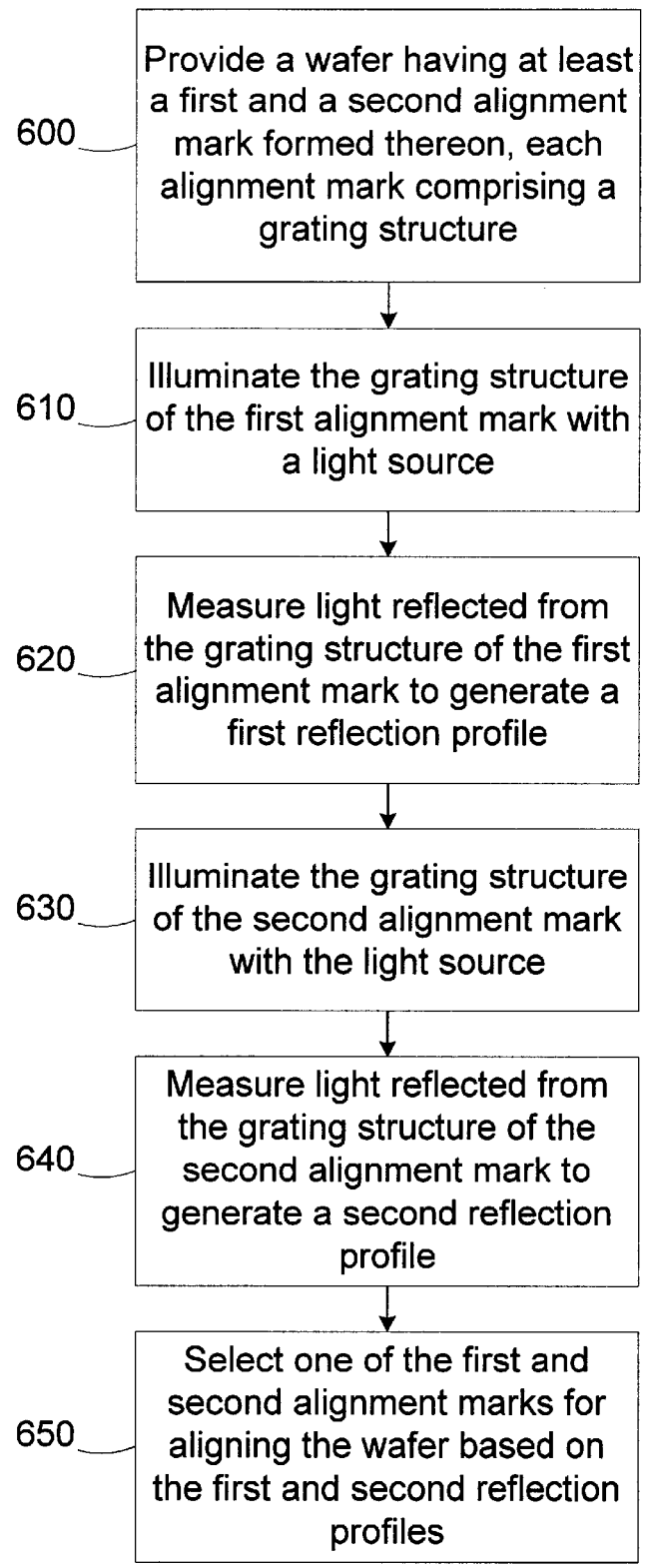
FIG. 6 is a simplified flow diagram of a method for aligning wafers in accordance with a second illustrative embodiment of the present invention.

FIG. 6 is a simplified flow diagram of a method for aligning wafers in accordance with an illustrative embodiment of the present invention. In block 600, a wafer having at least a first and a second alignment mark formed thereon is provided. Each alignment mark comprises a grating structure. In block 610, the grating structure of the first alignment mark is illuminated with a light source. Light reflected from the grating structure is measured to generate a first reflection profile in block 620. In block 630, the grating structure of the second alignment mark is illuminated with the light source. Light reflected from the grating structure is measured to generate a second first reflection profile in block 640. In block 650, one of the first and second alignment marks is selected for aligning the wafer based on the first and second reflection profiles.

Selecting the alignment marks 130, 135, 140 having the highest signal to noise ratio, as described above improves the accuracy at which the stepper 340 is able to align the wafer 100 for photolithographic processing. Improved alignment accuracy reduces overlay in the patterns formed and reduces the need to rework or scrap wafers. Accordingly, the quality of the devices produced on the processing line 300 and the efficiency of the processing line 300 are both increased.

In another embodiment of the present invention, the process controller 330 is adapted to determine at least one parameter of the operating recipe of the polishing tool 310 based on the degradation assessments of the alignment marks 130, 135, 140 to control polishing operations on subsequent wafers processed by the polishing tool 310. After receiving a grating degradation profile (e.g., overpolishing, underpolishing, or a combination of both) for the wafer 100 from the scatterometry tool 320, the process controller 330 provides feedback to the polishing tool 310 to reduce the polishing variation. That is, the grating degradation profile information may be used to determine or modify one or more parameters of polishing operations to be performed on subsequently processed wafers. Such control operations may be performed by the process controller 330 or a controller resident on the polishing tool 310.

Various techniques are known to those of ordinary skill on the art for controlling polishing profiles of polishing tools 310. The process controller 330 may use a control model relating the measured degradation profile to a particular operating recipe parameter in the polishing tool 310 to control the polishing rate in the region of the wafer 100 where the alignment marks 130, 135, 140 are formed to correct for any overpolishing or underpolishing. For example, the control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected.

Polishing models may be generated by the process controller 330, or alternatively, they may be generated by a different processing resource (not shown) and stored on the process controller 330 after being developed. The polishing models may be developed using the polishing tool 310 or using a different tool (not shown) having similar operating characteristics. For purposes of illustration, it is assumed that the polishing models are generated and updated by the process controller 330 or other processing resource based on the actual performance of the polishing tool 310 as measured by the scatterometry tool 320. The polishing models may be trained based on historical data collected from numerous processing runs of the polishing tool 310.

Parameters such as polishing arm range of motion, polishing pressure, etc., may be adjusted to affect the rate at which polishing occurs at various places on the wafer. One such technique for controlling polishing profile (e.g., center-fast or center-slow) is described in U.S. patent application Ser. No. 09/372,014, in the names of William Jarrett Campbell, Jeremy Lansford, and Christopher H. Raeder, entitled Method And Apparatus For Controlling Within-Wafer Uniformity In Chemical Mechanical Polishing, and incorporated herein by reference in its entirety.

Some polishing tools 310, such as an Auriga system offered by Speedfam-IPEC of Chandler, Ariz., and a Teres CMP system offered by Lam Research, Inc. of Fremont, Calif., have use-selectable pressure zones at different places on the polishing surface that may be used to control polish rates in the corresponding regions of the wafer. A technique for controlling polishing profile (e.g., center-fast or center-slow) by adjusting pressure in these controllable zones is described in U.S. patent application Ser. No. XX/XXX,XXX (Attorney Docket No. 2000.067000/DIR, Client Docket No. TT4275), in the names of Alexander J. Pasadyn, Christopher H. Raeder, and Anthony J. Toprac, entitled "METHOD AND APPARATUS FOR POST-POLISH THICKNESS AND UNIFORMITY CONTROL," and incorporated herein by reference in its entirety.

Figure 7:
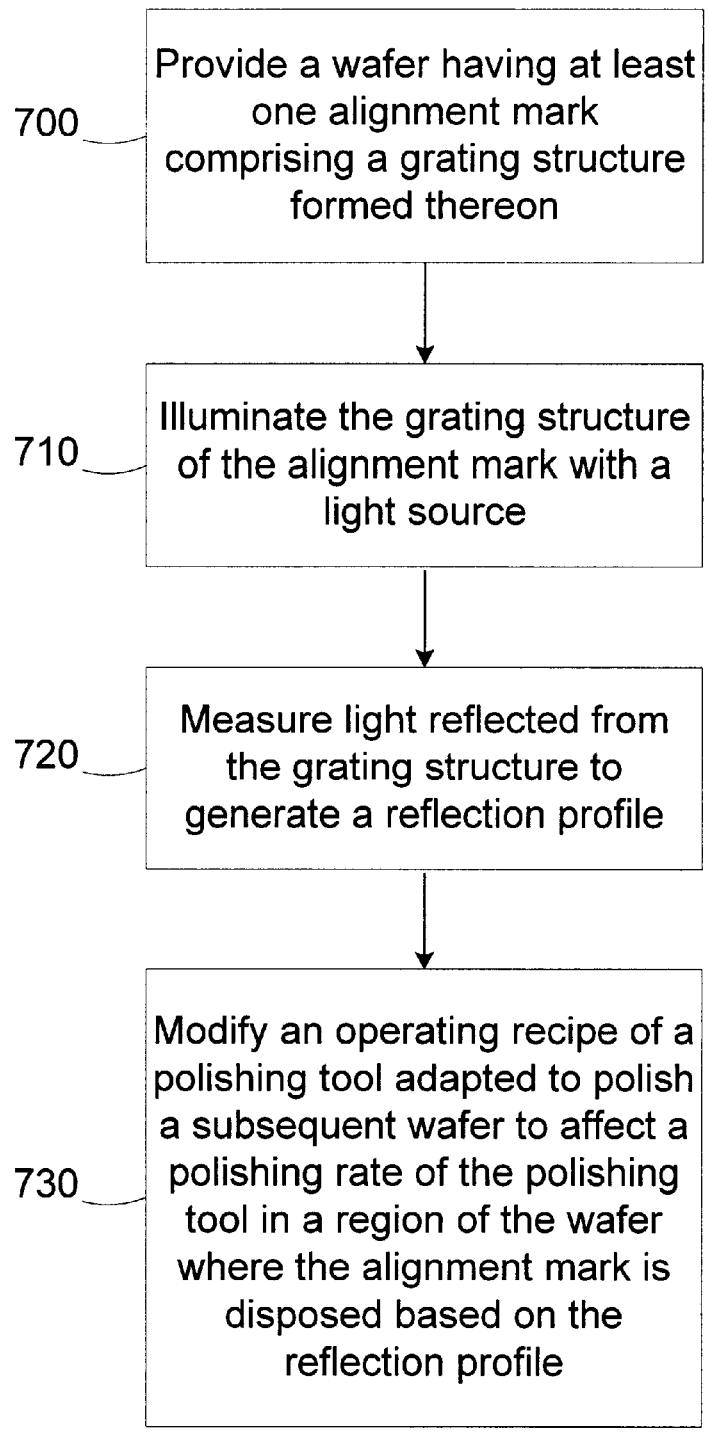
FIG. 7 is a simplified flow diagram of a method for polishing wafers in accordance with a third illustrative embodiment of the present invention.

FIG. 7 is a simplified flow diagram of a method for polishing wafers in accordance with an illustrative embodiment of the present invention. In block 700, a wafer having at least one alignment mark comprising a grating structure formed thereon is provided. In block 710, the grating structure of the alignment mark is illuminated with a light source. In block 720, light reflected from the grating structure is measured to generate a reflection profile. The reflection profile may be based on parameters such as the intensity or phase of the reflected light, the reflection angle of the reflected light, and the refraction angle of the reflected light. In block 730, an operating recipe of a polishing tool adapted to polish a subsequent wafer is modified to affect a polishing rate of the polishing tool in a region of the wafer where the alignment mark is disposed based on the reflection profile.

Controlling the polishing tool 310 based on feedback from the alignment mark characteristics, as described above, has numerous advantages. First, the uniformity of the polishing operation may be increased, due to the heretofore unavailable feedback mechanism for controlling polishing rates on the periphery of the wafer. Second, by controlling the polishing rate in the region of the wafer 100 where the alignment marks 130, 135, 140 are disposed, the degradation to which the alignment marks 130, 135, 140 are subjected may be reduced. Reducing the degradation increases the signal to noise ratio for all of the alignment marks 130, 135, 140, thus increasing the reliability and repeatability of the alignment process. Improved alignment accuracy reduces overlay in the patterns formed and reduces the need to rework or scrap wafers. Accordingly, the quality of the devices produced on the processing line 300 and the efficiency of the processing line 300 are both increased.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for aligning wafers, comprising:
   providing a wafer having at least a first and a second alignment mark formed thereon, each alignment mark comprising a grating structure;

illuminating the grating structure of the first alignment mark with a light source;

measuring light reflected from the grating structure of the first alignment mark to generate a first reflection profile;

illuminating the grating structure of the second alignment mark with the light source;

measuring light reflected from the grating structure of the second alignment mark to generate a second reflection profile;

quantifying degradation of the first and second alignment marks based on the first and second reflection profiles; and selecting one of the first and second alignment marks for aligning the wafer based on the quantified degradations of the first and second reflection profiles.

2. The method of claim 1, further comprising configuring a stepper to align the wafer using the selected one of the first and second alignment marks.

3. The method of claim 2, further comprising exposing a layer of photoresist formed on the wafer aligned using the selected one of the first and second alignment marks.

4. The method of claim 1, wherein quantifying the degradation of the first and second alignment marks further comprises:

comparing the first and second reflection profiles to a library of reference reflection profiles, each reference reflection profile having an associated degradation rating;

selecting a first reference reflection profile closest to the first reflection profile;

selecting a second reference reflection profile closest to the second reflection profile; and determining the degradation of the first and second alignment marks based on the associated degradation ratings.

5. The method of claim 1, wherein generating the first and second reflection profiles comprises generating the first and second reflection profiles based on at least one of intensity and phase of the reflected light.

6. The method of claim 1, further comprising determining at least one parameter of an operating recipe of a polishing tool adapted to polish a subsequent wafer based on at least one of the first and second reflection profiles.

7. The method of claim 6, further comprising associating at least one of the first and second reflection profiles with a polishing profile, and wherein determining at least one parameter of the operating recipe of the polishing tool comprises determining at least one parameter of the operating recipe of the polishing tool based on the polishing profile.

8. The method of claim 7, wherein determining at least one parameter of the operating recipe of the polishing tool comprises reducing a polishing rate of the polishing tool in a region of the wafer where the one of the first and second alignment marks selected for determining the polishing profile is disposed based on the polishing profile corresponding to an overpolish condition.

9. The method of claim 7, wherein determining at least one parameter of the operating recipe of the polishing tool comprises increasing a polishing rate of the polishing tool in a region of the wafer where the one of the first and second alignment marks selected for determining the polishing profile is disposed based on the polishing profile corresponding to an underpolish condition.

10. The method of claim 1, wherein quantifying the degradation of the first and second alignment marks further comprises:

comparing the first and second reflection profiles to a target reflection profile; and quantifying the degradation of the first and second alignment marks based on the comparisons between the first and second alignment marks and the target reflection profile.

11. A method for aligning wafers, comprising:

providing a wafer having at least a first and a second alignment mark formed thereon, each alignment mark comprising a grating structure;

illuminating the grating structure of the first alignment mark with a light source;

measuring light reflected from the grating structure of the first alignment mark to generate a first reflection profile;

illuminating the grating structure of the second alignment mark with the light source;

measuring light reflected from the grating structure of the second alignment mark to generate a second reflection profile;

comparing the first and second reflection profiles to a library of reference reflection profiles, each reference reflection profile having an associated degradation rating;

selecting a first reference reflection profile closest to the first reflection profile;

selecting a second reference reflection profile closest to the second reflection profile;

selecting the one of the first and second alignment marks corresponding to the one of the first and second reference reflection profiles having a lower associated degradation rating; and configuring a stepper to align the wafer using the selected one of the first and second alignment marks.

12. A method for aligning wafers, comprising:

providing a wafer having at least a first and a second alignment mark formed thereon, each alignment mark comprising a grating structure;

illuminating the grating structure of the first alignment mark with a light source;

measuring light reflected from the grating structure of the first alignment mark to generate a first reflection profile;

illuminating the grating structure of the second alignment mark with the light source;

measuring light reflected from the grating structure of the second alignment mark to generate a second reflection profile;

comparing the first and second reflection profiles to a target reflection profile;

quantifying the degradation of the first and second alignment marks based on the comparisons between the first and second alignment marks and the target reflection profile;

selecting the one of the first and second alignment marks having the lesser quantified degradation; and configuring a stepper to align the wafer using the selected one of the first and second alignment marks.

13. A processing line, comprising:

a metrology tool adapted to receive a wafer having at least a first and a second alignment mark formed thereon, each alignment mark comprising a grating structure, the metrology tool being further adapted to illuminate the grating structure of the first alignment mark with a light source, measure light reflected from the grating structure of the first alignment mark to generate a first reflection profile, illuminate the grating structure of the second alignment mark with the light source, measure light reflected from the grating structure of the second alignment mark to generate a second reflection profile, and quantify degradation of the first and second alignment marks based on the first and second reflection profiles; and a process controller adapted to select one of the first and second alignment marks for aligning the wafer based on the quantified degradations of the first and second reflection profiles.

14. The processing line of claim 13, further comprising a stepper adapted to align the wafer, wherein the process controller is adapted to configure the stepper to align the wafer using the selected one of the first and second alignment marks.

15. The processing line of claim 14, wherein the stepper is further adapted to expose a layer of photoresist formed on the wafer aligned using the selected one of the first and second alignment marks.

16. The processing line of claim 13, wherein the metrology tool is further adapted to compare the first and second reflection profiles to a library of reference reflection profiles, each reference reflection profile having an associated degradation rating, select a first reference reflection profile closest to the first reflection profile, and select a second reference reflection profile closest to the second reflection profile, and the process controller is further adapted to select the one of the first and second alignment marks corresponding to the one of the first and second reference reflection profiles having a lower associated degradation rating.

17. The processing line of claim 13, wherein the metrology tool is further adapted to generate the first and second reflection profiles based on at least one of intensity and phase of the reflected light.

18. The processing line of claim 13, further comprising a polishing tool adapted to polish a subsequent wafer, wherein the process controller is further adapted to determine at least one parameter of an operating recipe of the polishing tool based on at least one of the first and second reflection profiles.

19. The processing line of claim 18, wherein the metrology tool is further adapted to associate at least one of the first and second reflection profiles with a polishing profile, and the process controller is further adapted to determine at least one parameter of the operating recipe of the polishing tool based on the polishing profile.

20. The processing line of claim 19, wherein the process controller is further adapted to reduce a polishing rate of the polishing tool in a region of the wafer where the one of the first and second alignment marks selected for determining the polishing profile is disposed based on the polishing profile corresponding to an overpolish condition.

21. The processing line of claim 19, wherein the process controller is further adapted to increase a polishing rate of the polishing tool in a region of the wafer where the one of the first and second alignment marks selected for determining the polishing profile is disposed based on the polishing profile corresponding to an underpolish condition.

22. The processing line of claim 13, wherein the metrology tool comprises at least one of a scatterometer, an ellipsometer, and a reflectometer.

23. The processing line of claim 13, wherein the metrology tool is further adapted to compare the first and second reflection profiles to a target reflection profile and quantify the degradation of the first and second alignment marks based on the comparisons between the first and second alignment marks and the target reflection profile.

24. A processing line, comprising:

a stepper adapted to align a wafer;

a metrology tool adapted to receive a wafer having at least a first and a second alignment mark formed thereon, each alignment mark comprising a grating structure, the metrology tool being further adapted to illuminate the grating structure of the first alignment mark with a light source, measure light reflected from the grating structure of the first alignment mark to generate a first reflection profile, illuminate the grating structure of the second alignment mark with the light source, measure light reflected from the grating structure of the second alignment mark to generate a second first reflection profile, compare the first and second reflection profiles to a library of reference reflection profiles, each reference reflection profile having an associated degradation rating, select a first reference reflection profile closest to the first reflection profile, and select a second reference reflection profile closest to the second reflection profile; and a process controller adapted to select the one of the first and second alignment marks corresponding to the one of the first and second reference reflection profiles having a lower associated degradation rating, and configure the stepper to align the wafer using the selected one of the first and second alignment marks.

25. A processing line, comprising:

a stepper adapted to align a wafer;

a metrology tool adapted to receive a wafer having at least a first and a second alignment mark formed thereon, each alignment mark comprising a grating structure, the metrology tool being further adapted to illuminate the grating structure of the first alignment mark with a light source, measure light reflected from the grating structure of the first alignment mark to generate a first reflection profile, illuminate the grating structure of the second alignment mark with the light source, measure light reflected from the grating structure of the second alignment mark to generate a second first reflection profile, and compare the first and second reflection profiles to a target reflection profile to determine a degradation rating for each of the first and second alignment marks; and a process controller adapted to select the one of the first and second alignment marks corresponding to the one of the first and second reference reflection profiles having a lower associated degradation rating, and configure the stepper to align the wafer using the selected one of the first and second alignment marks.

26. A processing line, comprising:

means for aligning a wafer having at least a first and a second alignment mark formed thereon, each alignment mark comprising a grating structure;

means for illuminating the grating structure of the first alignment mark with a light source, means for measuring light reflected from the grating structure of the first alignment mark to generate a first reflection profile;

means for illuminating the grating structure of the second alignment mark with the light source;

means for measuring light reflected from the grating structure of the second alignment mark to generate a second reflection profile;

means for quantifying degradation of the first and second alignment marks based on the first and second reflection profiles; and means for selecting one of the first and second alignment marks for aligning the wafer based on the quantified degradations of the first and second reflection profiles.

27. The processing line of claim 26, further comprising:

means for comparing the first and second reflection profiles to a library of reference reflection profiles, each reference reflection profile having an associated degradation rating;

means for selecting a first reference reflection profile closest to the first reflection profile;

means for selecting a second reference reflection profile closest to the second reflection profile; and means for selecting the one of the first and second alignment marks corresponding to the one of the first and second reference reflection profiles having a lower associated degradation rating.

28. The processing line of claim 26, further comprising:

means for comparing the first and second reflection profiles to a target reflection profile;

means for quantifying the degradation of the first and second alignment marks based on the comparisons between the first and second alignment marks and the target reflection profile; and means for selecting the one of the first and second alignment marks having the lesser quantified degradation.

* * * * *